(12) United States Patent
Haas et al.

(10) Patent No.: US 6,437,349 B1
(45) Date of Patent: Aug. 20, 2002

(54) FLUID NOZZLE SYSTEM AND METHOD IN AN EMITTED ENERGY SYSTEM FOR PHOTOLITHOGRAPHY

(75) Inventors: Edwin G. Haas, Sayville; Robert M. Gutowski, Glen Oaks; Vincent S. Calia, Greenlawn, all of NY (US)

(73) Assignee: Advanced Energy Systems, Inc., Bethpage, NY (US)

( * ) Notice: Subject to any disclaimer, the term of this patent is extended or adjusted under 35 U.S.C. 154(b) by 6 days.

(21) Appl. No.: 09/598,664

(22) Filed: Jun. 20, 2000

Related U.S. Application Data

(62) Division of application No. 09/054,831, filed on Apr. 3, 1998.

(51) Int. Cl.$^7$ ................................. H05H 1/34
(52) U.S. Cl. .................. 250/492.1; 250/492.2
(58) Field of Search .............. 250/492.1, 492.2, 250/493, 423 P, 492.24

(56) References Cited

U.S. PATENT DOCUMENTS

| | | | |
|---|---|---|---|
| 3,156,950 A | 11/1964 | Walton, Jr. | 18/8 |
| 3,550,864 A | 12/1970 | East | 239/601 |
| 3,620,457 A | 11/1971 | Pearson | 239/589 |
| 3,686,528 A | 8/1972 | Sheets | 315/111 |
| 3,709,434 A | 1/1973 | Gebhardt et al. | 239/8 |
| 3,876,149 A | 4/1975 | Futerko | 239/398 |
| 3,972,474 A | 8/1976 | Keur | 239/102 |

(List continued on next page.)

FOREIGN PATENT DOCUMENTS

| | | |
|---|---|---|
| DE | 2705551 | 8/1978 |
| EP | 0858249 A | 8/1998 |
| GB | 809372 | 2/1959 |
| GB | 2055058 A | 6/1980 |
| WO | 9525370 A | 9/1995 |
| WO | 9834234 A | 8/1998 |

OTHER PUBLICATIONS

Electron–Gun–Driven EUV Lithography System, OSA Proceedings On Extreme Ultraviolet Lithography, vol. 23, Alan M. Todd, Ira S. Lehrman, Jayaram Krishnaswamy, Vincent Calia, and Robert Gutowski, pp. 274–277, 1994.
Cluster Formation in Expanding Supersonic Jets: Effect Of Pressure, Temperature, Nozzle Size, and Test Gas, O.F. Hagena and W. Obert, The Journal of Chemical Physics, vol. 56, No. 5, pp. 1793–1802, Mar. 1, 1972.
Cluster Ion Sources (Invited), Otto F. Hagena, Rev. Sci, Instrum., vol. 63, No. 4, pp. 2374–2379, Apr. 00, 1992.
Density measurements of a Pulsed Supersonic Gas Jet Using Nuclear Scattering, J.G. Pronco, D. Kohler, I.V. Chapman, T.T. Bardin, P.C. Filbert, and J.D. Hawley, Rev. Sci. Instrum., vol. 4, No. 7, pp. 1744–1747, Jul. 1993.

*Primary Examiner*—John R. Lee
*Assistant Examiner*—Anthony Quash
(74) *Attorney, Agent, or Firm*—Baker Botts L.L.P.

(57) ABSTRACT

An emitted energy system for use in photolithography may include a fluid nozzle. A nozzle and its method of manufacture are provided. A nozzle (22) may include a nozzle cavity (110) disposed within a nozzle body (100) between an up-stream end (102) and a down-stream end (104). A nozzle passage (118) may be defined within the nozzle cavity (110) and extend a longitudinal length (120) from the down-stream end (104) of the nozzle body (100) into the nozzle cavity (110). A discharge orifice (124) may also be defined at the down-stream end (104) of the nozzle cavity (110) and have an associated width (126). The width (126) of the discharge orifice (124) may be substantially less than the longitudinal length (120) of the nozzle passage (118).

18 Claims, 4 Drawing Sheets

U.S. PATENT DOCUMENTS

| | | | |
|---|---|---|---|
| 4,161,280 A | 7/1979 | Kasinskas | 239/1 |
| 4,178,078 A | 12/1979 | Hausmann | 350/319 |
| 4,408,338 A | 10/1983 | Grobman | 378/34 |
| 4,455,470 A | 6/1984 | Klein et al. | 219/121 |
| 4,549,082 A | 10/1985 | McMillan | 250/423 |
| 4,560,880 A | 12/1985 | Petric et al. | 250/441.1 |
| 4,577,122 A | 3/1986 | Kung | 307/425 |
| 4,584,479 A | 4/1986 | Lamattina et al. | 250/441.1 |
| 4,607,167 A | 8/1986 | Petric | 250/492.2 |
| 4,692,934 A | 9/1987 | Forsyth | 378/34 |
| 4,730,784 A | 3/1988 | Boch et al. | 239/416.4 |
| 4,820,927 A | 4/1989 | Langner et al. | 250/492.2 |
| 4,830,280 A | 5/1989 | Yankoff | 239/11 |
| 4,954,715 A | 9/1990 | Zold | 250/461.1 |
| 4,980,563 A | 12/1990 | George et al. | 250/492.2 |
| 4,982,067 A | 1/1991 | Marantz et al. | 219/121.47 |
| 4,990,789 A | 2/1991 | Uesaki | 250/504 |
| 5,012,105 A | 4/1991 | Ando et al. | 250/398 |
| 5,012,853 A | 5/1991 | Bihlmaier | 164/75 |
| 5,103,102 A | 4/1992 | Economou et al. | 250/492.2 |
| 5,115,135 A * | 5/1992 | Oomori et al. | 250/423 P |
| 5,175,929 A | 1/1993 | Anthony et al. | 29/890.142 |
| 5,185,552 A | 2/1993 | Suzuki et al. | 313/231.71 |
| 5,204,506 A | 4/1993 | Asmus et al. | 219/121.37 |
| 5,206,594 A * | 4/1993 | Zipf | 324/464 |
| 5,214,290 A | 5/1993 | Sakai | 250/492.2 |
| 5,298,835 A | 3/1994 | Muehlberger et al. | 315/111.21 |
| 5,376,791 A | 12/1994 | Swanson et al. | 250/309 |
| 5,499,282 A | 3/1996 | Silfvast | 378/119 |
| 5,577,092 A | 11/1996 | Kubiak et al. | 378/119 |
| 5,643,801 A | 7/1997 | Ishihara et al. | 437/7 |
| 5,644,137 A | 7/1997 | Waggener et al. | 250/492.2 |
| 5,998,097 A * | 12/1999 | Hatakeyama | 430/296 |

* cited by examiner

FLUID NOZZLE SYSTEM AND METHOD IN AN EMITTED ENERGY SYSTEM FOR PHOTOLITHOGRAPHY

RELATED APPLICATIONS

This application is a divisional of U.S. application Ser. No. 09/054,831, filed Apr. 3, 1998, by Edwin G. Haas, Robert M. Gutowski and Vincent S. Calia, and entitled "FLUID NOZZLE SYSTEM AND METHOD IN AN EMITTED ENERGY SYSTEM FOR PHOTOLITHOGRAPHY".

This application is related to the following pending patent applications: Emitted Energy System for Photolithography, filed Apr. 3, 1998, Ser. No. 09/055,024, which is a continuation-in-part of Method and Apparatus for Producing Extreme Ultra-violet Light for Use in Photolithography, filed Feb. 4, 1997, Ser. No. 08/794,802, Holder Assembly System and Method in an Emitted Energy System for Photolithography, filed Apr. 3, 1998, Ser. No. 09/055,035; Method of Manufacturing Very Small Diameter Deep Passages, filed Apr. 3, 1998, Ser. No. 09/054,987; Diffuser System and Method in an Emitted Energy System for Photolithography, filed Apr. 3, 1998, Ser. No. 09/055,034; and Method and Apparatus for Adjustably Supporting a Light Source for use in Photolithography, filed Apr. 3, 1998, Ser. No. 09/054,977.

TECHNICAL FIELD OF THE INVENTION

This invention relates generally to the field of fluid dynamics and more particularly to a fluid nozzle system and method in an emitted energy system that may be used for photolithography production of semiconductor components.

BACKGROUND OF THE INVENTION

Photolithographic fabrication of semiconductor components, such as integrated circuits and dynamic RAM (DRAM) chips, is customary in the semiconductor industry. In photolithographic fabrication, light may be used to cure or harden a photomask that is used to form a pattern of conductive, semiconductive, and insulative components in the semiconductor layer. The resulting pattern of conductive, semiconductive, and insulative components on the semiconductor layer form extremely small microelectronic devices, such as transistors, diodes, and the like. The microelectronic devices are generally combined to form various semiconductor components.

The density of the microelectronic devices on the semiconductor layer may be increased by decreasing the size or geometry of the various conductive, semiconductive, and insulative components formed on the semiconductor layer. This decrease in size allows a larger number of such microelectronic devices to be formed on the semiconductor layer. As a result, the computing power and speed of the semiconductor component may be greatly improved.

The lower limit on the size, often referred to as the linewidth, of a microelectronic device is generally limited by the wavelength of light used in the photolithographic process. The shorter the wavelength of light used in the photolithographic process, the smaller the size or linewidth of the microelectronic device that may be formed on the semiconductor layer. Semiconductor component fabrication may be further improved by increasing the intensity of the light used in the photolithographic process, which reduces the time the photomask material needs to be radiated with light. Accordingly, the greater the intensity of light used in the photolithographic process, the shorter the time the photomask material is radiated with light. As a result, the semiconductor components may be produced faster and less expensively.

Extreme ultra-violet (EUV) light has a very short wavelength and is preferable for photolithographic fabrication of semiconductor components. Conventional methods of generating EUV light typically include impinging an energy source into a hard target to produce, or radiate, EUV light. The energy source may be a high energy laser, electron beam, an electrical arc, or the like. The hard target is generally a ceramic, thin-film, or solid target comprising such materials as tungsten, tin, copper, gold, solid xenon, or the like. Optics, such as mirrors and lenses, are used to reflect and focus the EUV light on the semiconductor layer.

Conventional energy beam systems and processes suffer from numerous disadvantages. One disadvantage of conventional methods of producing EUV light is that debris from the energy source/target interaction is produced during the production of the EUV light. The production of debris increases with the intensity of the energy source and results in the target being degraded and eventually destroyed. The debris may coat and contaminate the optics and other components of the energy beam system, thereby reducing the efficiency and performance of the system. The reduced performance requires a greater frequency of system maintenance and system downtime.

SUMMARY OF THE INVENTION

Accordingly, a need has arisen for an improved emitted energy system and method. One embodiment of an improved emitted energy system and method includes a fluid nozzle. The present invention provides a fluid nozzle system and method that substantially eliminates or reduces problems associated with the prior systems and methods.

In accordance with one embodiment of the present invention, a fluid nozzle includes a nozzle cavity formed within a nozzle body. The nozzle cavity has an up-stream end and a down-stream end. A nozzle passage is defined within the nozzle cavity and extends a longitudinal length from the down-stream end into the nozzle cavity. The nozzle cavity includes a discharge orifice at the down-stream end of the nozzle cavity. The discharge orifice has an associated width that is substantially less than the longitudinal length of the nozzle passage.

The invention provides several technical advantages. For example, the invention allows the desired fluid flow properties of a fluid flowing through the fluid nozzle to be achieved, such as a high Mach number fluid velocity over an extended nozzle length. The extended nozzle length allows the fluid particles that form the fluid to cluster together and increase in size. Another technical advantage of the present invention is that the nozzle allows a small and well defined fluid plume to be formed by the discharge of the fluid from the nozzle. Yet another technical advantage of the present invention is that the nozzle is sufficiently small that only small amounts of fluid are used. This becomes economically important when expensive fluids are used or the fluid is removed by an expensive pumping system. A further technical advantage of the present invention is that the nozzle is less expensive to fabricate than conventional nozzles.

Other technical advantages will be readily apparent to one skilled in the art from the following figures, descriptions, and claims.

BRIEF DESCRIPTION OF THE DRAWINGS

For a more complete understanding of the present invention, the objects and advantages thereof, reference is now made to the following descriptions taken in conjunction with the accompanying drawings in which.

DETAILED DESCRIPTION OF THE INVENTION

The preferred embodiment of the present invention and its advantages are best understood by referring to FIGS. 1 through 6 of the drawings, like numerals being used for like and corresponding parts of the various drawings.

FIGS. 1 through 6 illustrate an emitted energy system in accordance with one embodiment of the present invention. As described in more detail below, the emitted energy system may comprise a fluid system and an energy system that interact to produce a beam of emitted energy. The emitted energy may be extreme ultra-violet light for use in photolithographic production of microelectronic devices in semiconductor components. The extreme ultra-violet light allows the economical fabrication of microelectronic devices having linewidths smaller than 100 nanometers. Accordingly, the emitted energy system increases the number of microelectronic devices that may be placed on a semiconductor layer, thereby increasing the potential computing power and speed of a semiconductor component, such as an integrated circuit chip, memory chip, or the like.

Figure 1:
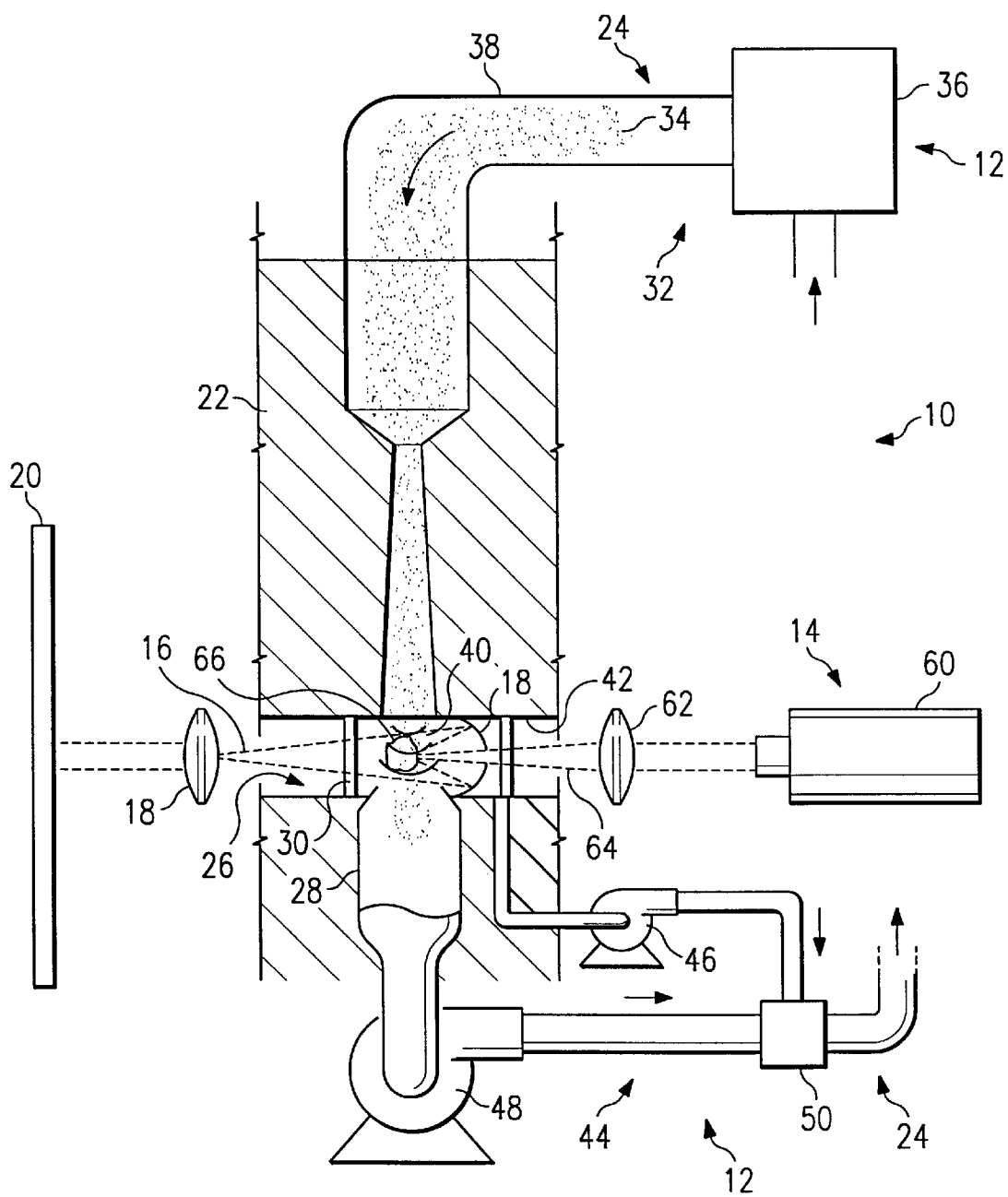
FIG. 1 is a drawing in section with portions broken away illustrating an emitted energy system in accordance with one embodiment of the present invention.

FIG. 1 is a drawing in section with portions broken away illustrating an emitted energy system 10 in accordance with one embodiment of the present invention. In this embodiment, the emitted energy system 10 may be used to generate extreme ultra-violet light for use in photolithography. It will be understood that the emitted energy system 10 may be otherwise used without departing from the scope of the present invention. For example, the emitted energy system 10 may be used to produce other wave lengths of light and can be used for welding, machining, chemistry, biological research, materials research, communication systems, and the like.

Referring to FIG. 1, the emitted energy system 10 comprises a fluid system 12 and an energy system 14 that interact to generate an emitted energy 16. The emitted energy 16 may be collected and directed by an output optics 18 to a target 20. It will be understood that the emitted energy system 10 may include other suitable components without departing from the scope of the present invention.

In one embodiment, the fluid system 12 includes a nozzle 22 and a fluid supply system 24. In another embodiment, the fluid system 12 includes the fluid supply system 24 and a subsystem 26 comprising the nozzle 22, a diffuser 28, and a holder assembly 30 that maintains the alignment between the nozzle 22 and the diffuser 28.

The fluid supply system 24 includes a supply system 32. The supply system 32 operates to supply a fluid 34 to the nozzle 22. In one embodiment, the supply system 32 includes a supply tank 36 containing pressurized fluid 34, connecting lines 38 between the supply tank 36 and the nozzle 22, and a pressure regulator (not shown). It will be understood that the supply system 32 may include other suitable components without departing from the scope of the present invention. For example, the supply system 32 may include a flow regulator, a filter, or other suitable devices.

The pressurized fluid 34 flows through the nozzle 22 and is discharged in a fluid plume 40. In general, the fluid plume 40 is formed within a chamber 42. The chamber 42 may be evacuated to a hard vacuum on the order of one millitorr. It will be understood that the chamber 42 may be otherwise evacuated without departing from the scope of the present invention.

The fluid 34 is generally gaseous in form as it flows through the nozzle 22. In one embodiment, the fluid 34 is a noble gas such as xenon. It will be understood that the fluid 34 may be any material or combination of materials that produce the desired emitted energy 16 during the interaction of the fluid system 12 and the energy system 14 without departing from the scope of the present invention. For example, the fluid 34 may be iodine, sodium, a noble gas such as argon or helium, or other suitable material.

In one embodiment, the chamber 42 captures the fluid 34 exiting the nozzle 22. In another embodiment, the diffuser 28 captures substantially all of the fluid 34 in the fluid plume 40. In this embodiment, the holder assembly 30 operates to maintain precise alignment between the nozzle 22 and the diffuser 28 to optimize operation of the diffuser 28 such that the fluid plume 40 is substantially captured by the diffuser 28. It will be understood that the fluid 34 may be otherwise captured without departing from the scope of the present invention.

The fluid supply system 24 may also include a recycle system 44 that operates to remove the captured fluid 34. The captured fluid 34 may then be recirculated back to the supply system 32 for reuse. In one embodiment, the recycle system 44 is connected to the chamber 42. In another embodiment, the recycle system 44 is connected to the diffuser 28 and the chamber 42. It will be understood that the recycle system 44 may be otherwise configured without departing from the scope of the present invention.

The recycle system 44 includes a chamber pump 46 connected to the chamber 42 to collect and remove the fluid 34 and any contaminates from the chamber 42. It will be understood that the chamber pump 46 may comprise any suitable device or system for evacuating the chamber 42 without departing from the scope of the present invention. For example, the chamber pump 46 may be a roughing pump, turbomolecular vacuum pump, cryopump, ion pump, or other suitable pump system or combination thereof.

In one embodiment, the recycle system 44 may include a diffuser pump 48 connected to the diffuser 28 to collect and remove the fluid 34 captured by the diffuser 28. It will be understood that the diffuser pump 48 may comprise any suitable device or system for removing the captured fluid 34 from the diffuser 28 without departing from the scope of the present invention. For example, the diffuser pump 48 may be a compressor, circulating pump, or other suitable pump system or combination thereof.

The recycle system 44 may also include a compressor 50 connected to the chamber pump 46 and/or the diffuser pump 48. The compressor 50 operates to receive the fluid 34 from the chamber pump 46 and/or the diffuser pump 48, compress the fluid 34, and then recycle the fluid 34 to the supply system 32. The recycle system 44 may also include a filter system (not shown), a cooling system (not shown), and connecting lines (not shown) between the recycle system 44 and the supply system 32. It will be understood that the recycle system 44 may comprise other suitable components without departing from the scope of the present invention.

In operation, the fluid supply system 24 may provide pressurized fluid 34 in the form of a gas to the nozzle 22. The pressurized fluid 34 flows through the nozzle 22. The discharge, or exit, of the fluid 34 from the nozzle 22 forms the fluid plume 40 in the chamber 42. The fluid 34 forming the fluid plume 40 is collected and removed by the recycle system 44.

In one embodiment, the recycle system 44 operates to remove the fluid 34 from the chamber 42. In this embodiment, the volume of the fluid 34 discharged from the nozzle 22 is such that the chamber pump 46 operates to maintain an acceptable vacuum within the chamber 42 during operation of the emitted energy system 10.

In an embodiment in which the recycle system 44 is coupled to the diffuser 28, the kinetic energy of the fluid 34 in the fluid plume 40 directs the fluid 34 into the diffuser 28, allowing the diffuser 28 to capture substantially all of the fluid 34 in the fluid plume 40. The diffuser 28 converts the kinetic energy of the fluid 34 into pressure to reduce the pumping speed requirements of the chamber pump 46. The holder assembly 30 maintains the alignment and position between the nozzle 22 and the diffuser 28.

The recycle system 44 may compress, cool, and filter the fluid 34 before returning the fluid 34 to the supply system 32. The fluid 34 may then be circulated back to the nozzle 22 for reuse.

The fluid flow characteristics of the fluid 34 in the fluid plume 40 are strictly controlled and substantially defined by the design of the nozzle 22. The design of the nozzle 22 generally controls the quantity of the fluid 34 being discharged, the average. size of clustered gas atoms or molecules of the fluid 34 in the fluid plume 40, the velocity of the fluid 34, and the temperature of the fluid 34, as well as the size and shape of the fluid plume 40. These flow characteristics may individually and in combination affect the operation of the emitted energy system 10.

The fluid 34 discharged from the nozzle 22 may be subsonic or supersonic. In one embodiment, the fluid 34 in the fluid plume 40 flows at a velocity of approximately Mach 3. In this embodiment, as discussed in detail below, the nozzle 22 may be designed to allow the atoms or molecules of the fluid 34 to cluster. Clustering of the fluid 34 increases the average particle size of the clustered atoms or molecules of the fluid 34 in the fluid plume 40. The clustered atoms or molecules of the fluid 34 in the fluid plume 40 may have an optimum cluster size which may increase the quantity of the emitted energy 16 produced during the interaction of the fluid system 12 and the energy system 14. Accordingly, the efficiency of the emitted energy system 10 is increased. Additionally, the emitted energy system 10 produces a relatively debris-free emitted energy 16 of a particular wavelength, or wavelengths, at an intensity that may be used in photolithography fabrication processes.

As illustrated in FIG. 1, the energy system 14 interacts with the fluid plume 40 within the chamber 42 to produce the emitted energy 16. The recycle system 44 is used to evacuate the chamber 42 to a very low vacuum pressure and to remove any contaminates from the chamber 42. Contaminates may include any atoms, molecules, ions, and material particulate contained within the chamber 42 that may degrade or interfere with the operation of the emitted energy system 10.

The energy system 14 may include an energy source 60 and an input optics 62 that are used in connection with the chamber 42 and the fluid plume 40 to generate the emitted energy 16. The energy source 60 and input optics 62 operate to produce an input energy 64 that excites the fluid 34 in the fluid plume 40 into producing the emitted energy 16. The energy source 60 and the input energy 64 are often dependent upon the fluid 34 used in the emitted energy system 10. In an embodiment in which the fluid 34 comprises xenon and the input energy 64 is a high power laser beam having a wavelength of approximately 1.064 microns, the emitted energy 16 is extreme ultraviolet light that may be used in photolithography production of semiconductor components. In this embodiment, the input energy 64 is produced by a Nd:YAG laser. It will be understood that the input energy 64 may be otherwise produced and be any other suitable energy that excites the fluid 34 into producing the desired wavelength(s) of the emitted energy 16 without departing from the scope of the present invention. For example, the input energy 64 may be an electric arc, ion or electron beam, coherent light such as a laser beam having different wavelengths, microwaves, or any other suitable energy. It will be further understood that other types of emitted energy 16 may be generated by the emitted energy system 10 without departing from the scope of the present invention.

The input energy 64 may be focused through the input optics 62 into the fluid plume 40 to form a plasma 66 that produces the emitted energy 16. The input energy 64 may be directed into the fluid plume 40 such that the quantity of the emitted energy 16 reabsorbed by the fluid 34 is minimized. Thus, the input energy 64 may be focused on the fluid plume 40 proximate the nozzle 22 such that the distance the emitted energy 16 travels through the fluid plume 40 is minimized. Some suitable types of input energy 64 do not require input optics 62, such as an electric arc. It will be understood that the present invention includes such types of input energy 64.

In one embodiment, the input optics 62 may be a system of mirrors and lenses that collect, transmit, and focus the input energy 64 into the fluid plume 40. It will be understood that the input optics 62 may be any suitable device or system for collecting, transmitting, or directing the input energy 64 into the fluid plume 40 without departing from the scope of the present invention.

The emitted energy 16 may be collected and directed by the output optics 18 to the target 20. In general, the output optics 18 will be arranged proximate the input energy 64, as the greatest intensity of the emitted energy 16 is produced proximate the input energy 64. In one embodiment, the output optics 18 may include a mirror system which substantially surrounds one end of the holder assembly 30 to reflect the emitted energy 16 through a system of mirrors and lenses. It will be understood that the output optics 18 may be any suitable device or system for collecting, transmitting, or directing the emitted energy 16 at the target 20 without departing from the scope of the present invention.

The target 20 may be any material or system at which the emitted energy 16 is directed. In one embodiment, the target 20 is a photolithography system interface 68 used in the photolithographic production of electronic devices. Other embodiments may utilize the emitted energy 16 in such simple applications as welding or manufacturing, or in such complicated applications as applied physics research, materials research, biological research, communications systems, and the like.

Figure 1A:
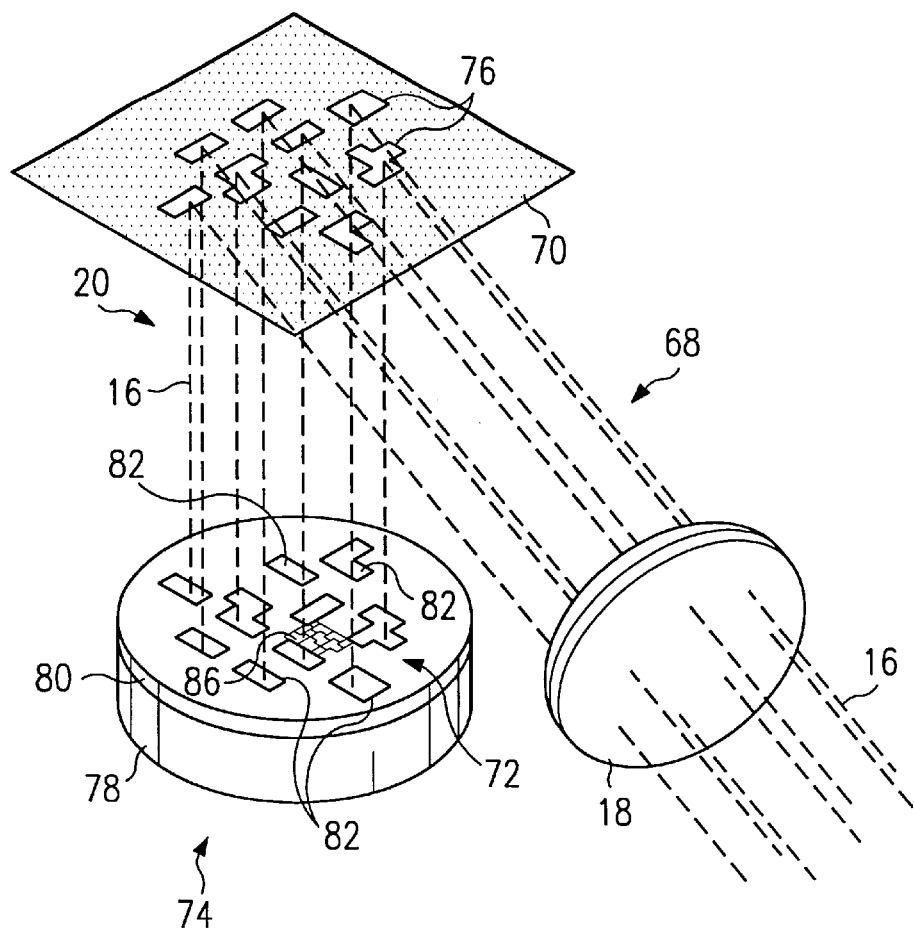
FIG. 1A is a perspective view of a photolithography system interface in accordance with one embodiment of the present invention.

FIG. 1A is a perspective view of the photolithography system interface 68 according to one embodiment of the present invention. In this embodiment, the emitted energy system 10 is used in the fabrication of a semiconductor device 70, such as an integrated circuit (IC), memory chip, application specific integrated circuit (ASIC), or the like.

The photolithography system interface 68 may include a mask 72 and a semiconductor target 74. The mask 72 allows only a portion of the emitted energy 16 incident upon the mask 72 to reach the semiconductor target 74. The mask 72 includes a mask pattern 76 such that the portion of the emitted energy 16 which reaches the semiconductor target 74 is in a pattern corresponding to the mask pattern 76. In other words, by screening the emitted energy 16 incident upon the mask 72, the mask 72 operates to replicate the mask pattern 76 onto the semiconductor target 74.

In one embodiment, the mask 72 comprises a mask pattern 76 of reflective regions surrounded by non-reflective regions. The emitted energy 16 incident on the non-reflective regions of the mask 72 is screened, while the emitted energy 16 incident on the reflective regions of the mask 72 is reflected to the semiconductor target 74. It will be understood that the mask 72 may comprise other devices or systems for forming a pattern of emitted energy 16 on the semiconductor target 74 without departing from the scope of the present invention. For example, the mask 72 may be a one-to-one mask, a de-magnifying mask, a reticle mask, or other suitable mask.

The semiconductor target 74 may comprise a substrate 78 covered by a photoresist layer 80. The substrate 78 may be a semiconductor such as a wafer formed from a single-crystalline silicon material, an epitaxial semiconductor layer, a polycrystalline semiconductor material, or a metallic such as aluminum, tungsten, or copper, or any other such suitable material. It will be understood that the substrate 78 may comprise other suitable materials and layers without departing from the scope of the present invention.

The photoresist layer 80 may be any suitable material that reacts to the emitted energy 16. For example, the photoresist layer 80 may react to the emitted energy 16 by curing, hardening, or positive or negative polymerization. in one embodiment, the photoresist layer 80 comprises Extreme UltraViolet (EUV) photoresist material. It will be understood that the photoresist layer 80 may be other suitable photo-reacting material without departing from the scope of the present invention.

A photoresist mask 82 is formed within the photoresist layer 80 by exposing the photoresist layer 80 to a pattern of emitted energy 16 such that the portion of the photoresist layer 80 exposed to the emitted energy 16 reacts to the emitted energy 16 by curing, hardening, polymerizing, or the like. The unreacted portion of the photoresist layer is then removed, exposing a portion of the underlying substrate 78. The remaining portion of the photoresist layer 80 forms the photoresist mask 82.

A structure 86 may be formed by semiconductor fabrication processes performed on the exposed portions of the underlying substrate 78, such as wet etching, dry etching, ion implantation, or other suitable semiconductor fabrication processes. The structure 86 may be a component of a microelectronic device, such as a gate, source/drain, moat, or the like. The structure 86 may be processed to form the semiconductor device 70. The photolithography system interface 68 may include other devices and systems for directing the emitted energy 16 without departing from the scope of the present invention. For example, the photolithography system interface 68 may include additional optics, mirrors, or masks, that may affect the pattern of the emitted energy 16 impinging the photoresist layer 80.

In operation, the photolithography system interface 68 receives the emitted energy 16 from the output optics 18 and directs the emitted energy 16 toward the mask 72. The mask 72 screens the emitted energy 16 such that a pattern of the emitted energy 16 is directed toward the photoresist layer 80 of the semiconductor target 74. The portion of the photoresist layer 80 upon which the emitted energy 16 is incident, reacts to the emitted energy 16. The non-reacted portion of the photoresist layer 80 is then removed to expose a portion of the underlying substrate 78. The remaining portion of the photoresist layer 80 forms the photoresist mask 82 in a pattern corresponding to the mask pattern 76 in the mask 72. Semiconductor fabrication processes such as wet etching, dry etching, ion implantation, or other suitable processes may then be performed on the exposed substrate 78 to form the structure 86. For example, the substrate 78 may be subjected to an ion implantation process such that a source region and a drain region of a transistor is formed. The substrate 78 could also be subjected to a plasma-based etch process such as a reactive ion etch (RIE) that anisotropically etches the substrate 78 to form an element of a transistor, such as a gate or a sidewall body.

The structure 86 may be processed by any suitable semiconductor fabrication process. The semiconductor fabrication processes act on the underlying substrate to form the structure 86, which may comprise portions of microelectronic devices such as transistors, capacitors, diodes, or the like. Various microelectronic devices may be combined to form a semiconductor device such as an integrated circuit (IC), memory chip, application specific integrated circuit (ASIC), or other such electronic devices.

In short, the emitted energy system allows the economical and debris-free production of an emitted energy. The emitted energy is produced in a manner that reduces contamination of the components of the emitted energy system. For example, the input and output optics, along with the surfaces of the diffuser, nozzle, chamber, and the holder assembly will not require the same level of maintenance and cleaning as required in conventional systems for producing an emitted energy. In addition, the fluid used to produce the emitted energy is not damaged or destroyed by operation of the emitted energy system. Furthermore, the emitted energy system may be economically produced because the pumping requirements of the recycle system may be reduced. Specifically, the pumping requirements of the chamber pump may be reduced.

In photolithographic applications, the emitted energy system will preferably produce extreme ultra-violet light at high intensity. The high intensity ultra-violet light attainable with the present invention will facilitate the cost effective fabrication of semiconductor devices that have microelectronic device features with linewidths of 100 nanometers or less. The emitted energy system will also allow a greater number of microelectronic devices to be placed within. the semiconductor device, which will correspondingly increase the computing power and speed of the semiconductor device.

Figure 2:
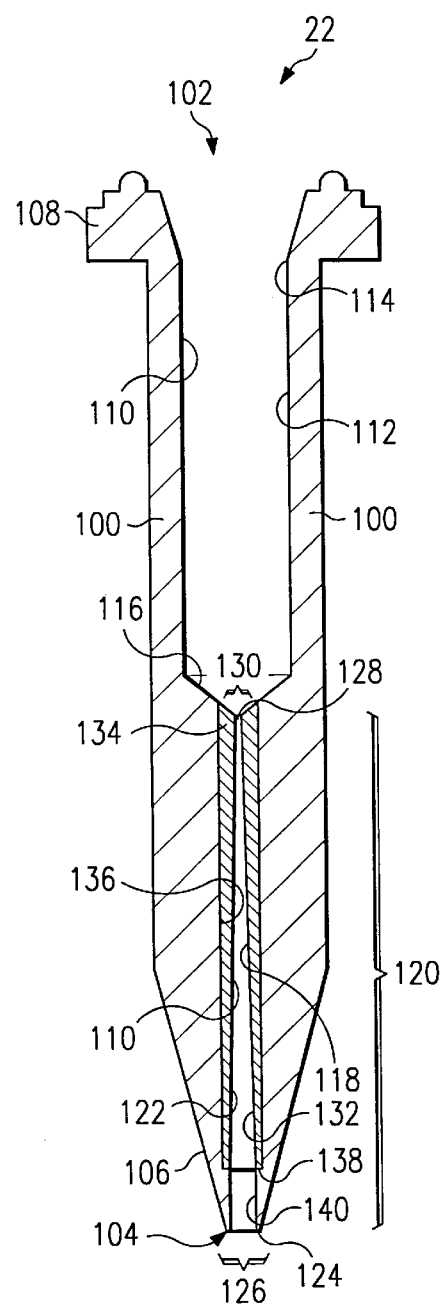
FIG. 2 is a cross section illustrating a nozzle used in the emitted energy system of FIG. 1 in accordance with one embodiment of the present invention.

FIG. 2 is a cross section illustrating the nozzle 22 in accordance with one embodiment of the present invention. In this embodiment, the nozzle 22 is used to generate the fluid plume 40. It will be understood that the nozzle 22 may be otherwise used without departing from the scope of the present invention. For example, the nozzle 22 may be used as a directional steering jet on a space vehicle, a fuel injector for a combustion chamber, an ink jet in an ink jet printer, or any other suitable use.

In one embodiment, the nozzle 22 includes a generally cylindrical nozzle body 100 having an up-stream end 102 and a down-stream end 104. The nozzle body 100 may be tapered adjacent to the down-stream end 104 of the nozzle body 100 to form a nozzle tip 106. The up-stream end 102 of the nozzle body 100 may include a boss 108 for connecting the up-stream end 102 of the nozzle 22 to the supply system 32. For example, the up-stream end 102 may be connected by welding, brazing, hydraulic fittings or other suitable standard hydraulic means to the supply system 32. It will be understood that the nozzle body 100 may be otherwise shaped and configured without departing from the scope of the present invention.

A nozzle cavity 110 is disposed within the nozzle body 100 between the up-stream end 102 and the down-stream end 104. The nozzle cavity 110 may include an inlet passage 112 defined within the up-stream end 102 of the nozzle cavity 110. The up-stream end 102 of the inlet passage 112 may form an inlet 114. The down-stream end 104 of the inlet passage 112 may form a transition passage 116. The inlet passage 112, inlet 114, and the transition passage 116 may include a diverging, converging, or straight passage, or any suitable combination thereof.

In one embodiment, the inlet passage 112 is generally cylindrical and the inlet 114 is straight, or in other words has a constant diameter. In this embodiment, the transition passage 116 is converging toward the down-stream end 104. It will be understood that the inlet passage 112 may be otherwise shaped or configured without departing from the scope of the present invention.

The nozzle cavity 110 also includes a nozzle passage 118 defined within the down-stream end 104 of the nozzle cavity 110. The nozzle passage 118 may have an associated longitudinal length 120. In one embodiment, the longitudinal length 120 of the nozzle passage 118 is between 0.1 and 1.0 inches. In a particular embodiment, the longitudinal length 120 of the nozzle passage 118 is approximately 0.5 inches. In another embodiment, the longitudinal length 120 is sized to allow the particles of fluid 34 to cluster. It will be understood that the longitudinal length 120 may be otherwise sized without departing from the scope of the present invention.

The nozzle passage 118 may also include a taper 122. In one embodiment, the taper 122 forms a diverging passage from the up-stream end 102 to the down-stream end 104 of the nozzle cavity 110. The taper 122 may be between 1 and 30 degrees. In a particular embodiment, the taper 122 is approximately 6°. It will be understood that the nozzle passage 118 may be otherwise tapered without departing from the scope of the present invention. For example, the taper 122 may be linear, non-linear, symmetric (i.e. conical) or non-symmetric (i.e. rectangular) and may be complex, containing diverging, converging, or straight passages, or any suitable combination thereof.

The down-stream end 104 of the nozzle passage 118 forms a discharge orifice 124. A diameter or average width 126 is associated with the discharge orifice 124. In one embodiment, the associated width 126 of the discharge orifice 124 is less than 0.25 inches. In a particular embodiment, the associated width 126 of the discharge orifice 124 is on the order of 0.02 inches. It will be understood that the discharge orifice 124 may be otherwise sized without departing from the scope of the present invention.

In another embodiment, the width 126 of the discharge orifice 124 may be substantially less than the longitudinal length 120 of the nozzle passage 118. In one embodiment, the width 126 of the discharge orifice 124 is less than the longitudinal length 120 of the nozzle passage 118 by a factor of at least 10. In a particular embodiment, the width 126 of the discharge orifice 124 is less than the longitudinal length 120 of the nozzle passage 118 by a factor of approximately 20. It will be understood that the longitudinal length 120 of the nozzle passage 118 may be otherwise varied relative to the width 126 of the discharge orifice 124 without departing from the scope of the present invention.

The transition between the inlet passage 112 and the nozzle passage 118 may form a throat 128. The throat 128 may be a diverging, converging, or straight passage, or any suitable combination thereof. The throat 128 has a diameter or average width 130 associated with the throat 128. In one embodiment, the throat 128 is a straight passage having a width 130 between 0.002 and 0.030 inches. In a particular embodiment, the throat 116 has an average width 130 of approximately 0.008 inches. It will be understood that the throat 128 may be otherwise sized without departing from the scope of the present invention. It will be further understood that the nozzle passage 118 may be otherwise configured without departing from the scope of the present invention. For example, the nozzle passage 118 may include other diverging, converging, or straight passages, or any suitable combination thereof.

In accordance with one aspect of the present invention, the nozzle passage 118 may be defined, at least in part, by an internal surface 132 of a miniature tube insert 134. The miniature tube insert 134 may be disposed in the nozzle cavity 110 between the inlet passage 112 and the down-stream end 104 of the nozzle body 100. In particular, the miniature tube insert 134 may be disposed in a tube passage 136 formed in the nozzle cavity 110. The tube passage 136 may be generally cylindrical in shape to frictionally receive the miniature tube insert 134. In addition, the tube passage 136 may have a diameter greater than the width 126 of the discharge orifice 124 in order to form a stop 138 for securing the miniature tube insert 134 in the nozzle body 100 during operation. The nozzle cavity 110 may also include a small bore passage 140 fabricated between the tube passage 136 and the down-stream end 104 of the nozzle body 100. It will be understood that the miniature tube insert 134 and the tube passage 136 may be otherwise fabricated and configured without departing from the scope of the present invention.

In a particular embodiment, the miniature tube insert 134 is fabricated with a small initial bore (not shown) within the miniature tube insert 134. The small bore passage 140 is similarly fabricated with a small initial bore (not shown). The miniature tube insert 134 is then frictionally inserted into the tube passage 136 flush with the stop 138 such that the initial bores are concentrically aligned. The concentric passages are then machined together to form the continuous nozzle passage 118. In another embodiment, the miniature tube insert 134 is electro-formed by electro-depositing a material on the outside diameter of the miniature tube insert 134 and machining the outside diameter to the specified diameter. The electro-formed miniature tube insert 134 can then be welded to form the nozzle tip 106.

In an alternative embodiment, the small bore passage 140 and the internal surface 132 of the miniature tube insert 134 are fabricated separately to achieve passage features that may not be achieved using conventional fabrication techniques.

Use of the miniature tube insert 134 allows fabrication of the relatively long nozzle passage 118 in very small diameter sizes that are not generally obtainable by conventional fabrication techniques. In addition, the tube passage 136 provides a sufficiently large passage for machining the small bore passage 140.

Furthermore, conventional fabrication techniques are generally expensive and may not be able to fabricate the nozzle passage 118 to obtain the desired fluid flow properties. After the miniature tube insert 134 has been fabricated, the miniature tube insert 134 may be inserted into the tube passage 136. In an embodiment in which the stop 138 is formed, the miniature tube insert 134 is inserted until the miniature tube insert 134 contacts the stop 138. In one embodiment, the miniature tube insert 134 is frictionally secured within the tube passage 136. It will be understood that the miniature tube insert 134 may be otherwise secured within the tube passage 136 and nozzle cavity 110 without departing from the scope of the present invention.

In operation, and according to the embodiment illustrated in FIGS. 1 and 2, the pressurized fluid 34 enters the nozzle 22 at the inlet 114. The fluid 34 flows through the transition passage 116 portion of the inlet passage 112 which may be converging for a short distance. The nozzle 22 is generally cooled to help maintain the temperature of the fluid 34. The fluid 34 passes through the throat 128 and into the nozzle passage 118 that is diverging. The diverging nozzle passage 118 allows the fluid 34 flowing through the nozzle passage 118 to expand, thereby further decreasing the temperature and pressure of the fluid 34. As the temperature and pressure of the fluid 34 decreases, the density of the fluid 34 flowing through the diverging nozzle passage 118 decreases. The longitudinal length 120 of the diverging discharge passage 118 is sufficient to produce clustering of the cooled fluid 34 flowing through the nozzle 22. Clustering is the clumping together of the atoms or molecules in the fluid 34, thereby increasing the particle size of the individual fluid particles within the clustered fluid 34 forming the fluid plume 40. This clustering is very important to the successful implementation of the fluid jet as a light-generating source.

The fluid 34 exits the discharge orifice 124 of the nozzle 22 at a high speed, generally at supersonic velocities. In one embodiment, the velocity of the fluid 34 exiting the discharge orifice 124 is approximately Mach 3. The high speed fluid 34 exiting the discharge orifice 124 and contains the clustered fluid 34 which forms the fluid plume 40. As discussed previously, the input energy 64 may be directed into the fluid plume 40 to form the plasma 66. The plasma 66 may produce the emitted energy 16 that is collected and directed by the output optics 18 onto the target 20.

The nozzle, although long and narrow in its internal passage must be very small in its throat diameter or cross-section. The nozzle must also be of smooth and regular internal contour so as to allow for unimpeded flow. The smaller the nozzle throat, the less gas will pass into the vacuum chamber at the required nozzle inlet thermodynamic state, so pumping requirements to maintain proper pressure in the vacuum chamber can be correspondingly reduced. In addition, the longitudinal length and the taper of the nozzle passage cools the fluid and allows sufficient time for the fluid particles to cluster. Accordingly, the fluid plume may have fluid characteristics that are optimal for producing the emitted energy in response to the input energy. Moreover, the size and shape of the fluid plume are strictly controlled and defined. Accordingly, the optimal location for directing the input energy into the fluid plume can be accurately determined to maximize the intensity of emitted energy produced.

Figure 3:
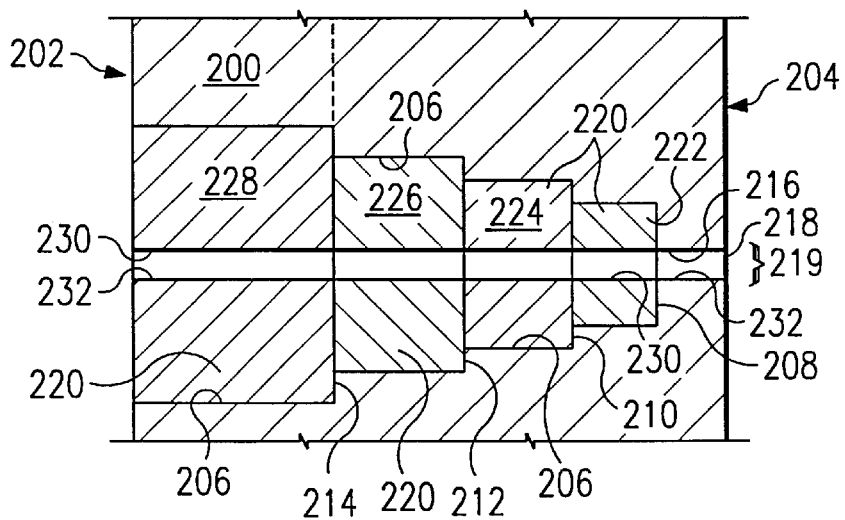
FIG. 3 is a cross section illustrating a method of manufacturing used to fabricate very small diameter deep passages, such as a very small diameter deep passage that may be used in the nozzle illustrated in FIG. 2 in accordance with one embodiment of the present invention.

FIG. 3 is a cross section illustrating a method of manufacturing very small diameter deep passages in accordance with one embodiment of the present invention. The method of manufacturing very small diameter deep passages may be used to fabricate passages such as the inlet passage 112 and the nozzle passage 118 of the nozzle 22 which cannot be readily fabricated using conventional machining techniques. Such conventional manufacturing techniques include micro-machining, LASER, and Electrical Discharge Machine (EDM) methods as well as electroforming. In addition to manufacturing very small diameter deep passages, the method may be used to fabricate other sized passages that are within the spirit and scope of the present invention.

Referring to FIG. 3, the method of manufacturing very small diameter deep passages may include providing an article 200 having a first side 202 and a second side 204. A recess 206 may be fabricated in the first side 202 of the article 200. In one embodiment and as illustrated in FIG. 3, the recess 206 includes a first portion 208, a second portion 210, a third portion 212, and a fourth portion 214. In this embodiment, each portion 208, 210, 212, and 214 is a constant diameter passage that is concentric to the other portions. It will be understood that the recess 206 may be otherwise configured, including having other shapes, sizes, or configurations without departing from the scope of the present invention. Thus, the recess 206 may include a single constant diameter passage, a single tapered passage, multiple cylindrical passages that may be concentric, and the like.

An article passage 216 may be formed between the second side 204 of the article 200 and the recess 206. The article passage 216 may be any shape or size and include parallel or tapered surfaces, contours, or any other detail as required by the application. The article passage 216 on the second side 204 of the article 200 may form an orifice 218 having a diameter 219. Similar to the article passage 216, the orifice 218 may be any suitable shape or size without departing from the scope of the present invention.

An insert 220 may be provided that is sized to fit the recess 206. For the embodiment illustrated in FIG. 3, the insert 220 includes a first button 222, a second button 224, a third button 226, and a fourth button 228, wherein each button is sized to fit a corresponding portion of the recess 206. It will be understood that the insert 220 or the buttons 222, 224, 226, and 228 forming the insert 220 may be otherwise configured including having other shapes or sizes without departing from the scope of the present invention. Thus, the insert 220 may include one or more buttons of the same or varying size and shape depending upon the size and shape of the recess 206 and upon the application.

An insert passage 230 may be fabricated in the insert 220. The insert passage 230 may be any shape or size and include parallel or tapered surfaces, contours, or any other detail as required by the application. In applications where the insert 220 includes one or more buttons, the insert passage 230 may be fabricated in each button. The insert passage 230 in each button may vary in size and shape depending upon the application. For example, in one embodiment the insert passage 230 is tapered. In another embodiment and as illustrated in FIG. 3, the insert passage 230 is constant in each button 222, 224, 226, and 228. It will be understood that the insert passage 230 may be other sizes, shapes, or configurations without departing from the scope of the present invention.

The insert 220 may be securably disposed within the recess 206 of the article 200. For the embodiment illustrated in FIG. 3, each button of the insert 220 is frictionally secured within that portion of the recess 206 corresponding to that particular button. In particular, the first button 222 is secured within the first portion 208 of the recess 206 with the insert passage 230 in the first button 222 aligned with the article passage 216 in the article 200. The second button 224 is then secured within the second portion 210 of the recess 206 with the insert passage 230 in the second button 224 aligned with the insert passage 230 in the first button 222. Similarly, the third button 226 is then secured within the third portion 212 of the recess 206 with the insert passage 230 in the third button 226 aligned with the insert passage 230 in the second button 224. Likewise, the fourth button 228 is secured within the fourth portion 214 of the recess 206 with the insert passage 230 in the fourth button 228 aligned with the insert passage 230 in the third button 226. It will be understood that the aforementioned process of stacking buttons within the recess may be repeated indefinitely to fabricate any diameter, size, or configuration of passage over an extended length or depth.

The article passage 216 in the article 200 and the insert passage 230 in the insert 220 may be aligned to form an extended passage 232 that is smaller than can be fabricated using conventional fabrication techniques.

In short, the method of manufacturing very small diameter deep passages allows a very small diameter passage to be fabricated in an article at depths and with precision that greatly exceed the depths and precision that conventional machining techniques can achieve. In addition, the method of manufacturing very small diameter deep passages may include fabricating the very small diameter passage such that minute contours and details, which may not be machinable using conventional machining techniques, may be machined into the micro-diameter passage. The method of manufacturing very small diameter deep passages is preferably used in situations where long, small cross-section passages having accurate features must be fabricated. The initial passages, such as the tube passage, may be used to provide sufficient access for coolant, electrolyte, or an EDM wire to fabricate additional internal features.

Figure 4:
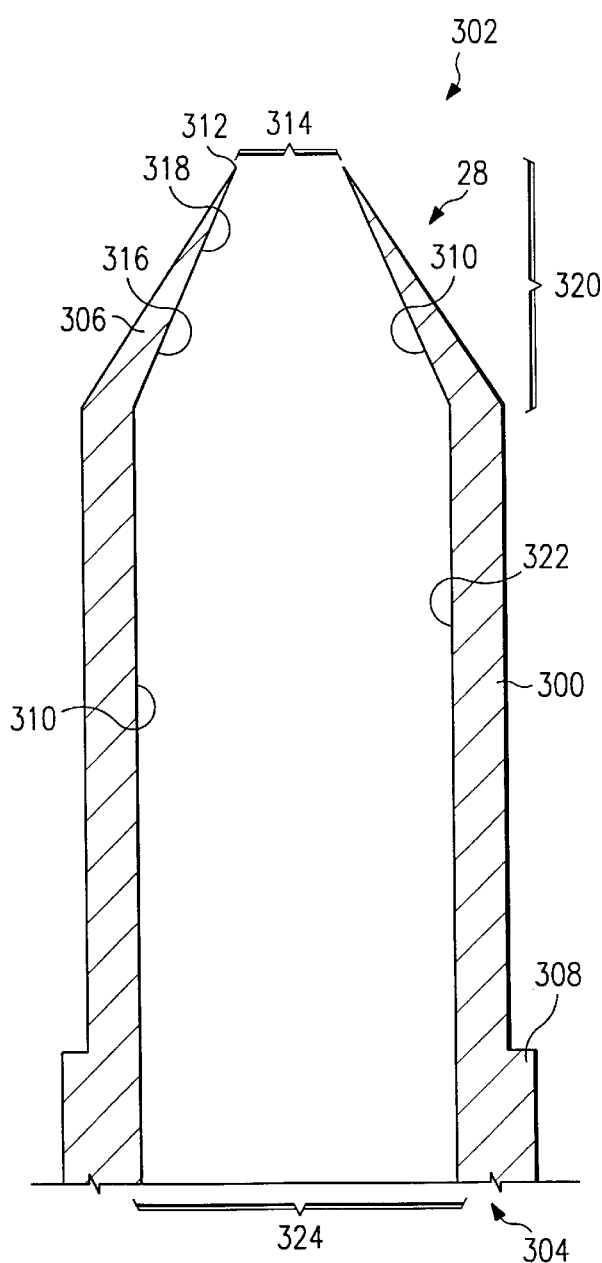
FIG. 4 is a cross section illustrating a diffuser used in the emitted energy system of FIG. 1 in accordance with one embodiment of the present invention.

FIG. 4 is a cross section illustrating the diffuser 28 in accordance with one embodiment of the present invention. In this embodiment, the diffuser 28 may be used to substantially capture the fluid plume 40 produced by the nozzle 22. It will be understood that the diffuser 28 may be otherwise used without departing from the scope of the present invention.

In one embodiment, the diffuser 28 may include a generally cylindrical diffuser body 300 having an inlet end 302 and an outlet end 304. The diffuser body 300 may be tapered adjacent the inlet end 302 of the diffuser body 300 to form a diffuser tip 306. The diffuser body 300 may also include a diffuser boss 308. The diffuser boss 308 may be used to longitudinally position and secure the diffuser 28 within the holder assembly 30. It will be understood that the diffuser body 300 may be otherwise shaped and configured without departing from the scope of the present invention.

A diffuser passage 310 is disposed within the diffuser body 300 and extends between the inlet end 302 and the outlet end 304. The inlet end 302 of the diffuser passage 310 may include a diffuser inlet 312. The diffuser inlet 312 may have an associated diameter or average width 314. In general, the width 314 of the diffuser inlet 312 is larger than the width 126 of the discharge orifice 124 in the nozzle 22 illustrated in FIG. 2. In one embodiment, the width 314 of the diffuser inlet 312 is larger than the width 126 of the discharge orifice 124 by a factor of approximately 10. In another embodiment, the width 314 of the diffuser inlet 312 is approximately 0.19 inches. It will be understood that the width 314 of the diffuser inlet 312 may be otherwise sized without departing from the scope of the present invention.

The diffuser passage 310 may also include a diffuser entry passage 316 extending from the diffuser inlet 312 toward the outlet end 304. The diffuser entry passage 316 may include a taper 318. The taper 318 may form a converging, diverging, or straight diffuser entry passage 316. In one embodiment, the diffuser entry passage 316 is a diverging passage in that the diameter of the diffuser entry passage 316 increases from the diffuser inlet 312. In this embodiment, the taper 318 of the diffuser entry passage 316 is less than 90 degrees. In a particular embodiment, the taper 318 of the diffuser entry passage 316 is approximately 30 degrees. It will be understood that the diffuser entry passage 316 may be otherwise configured and internally contoured without departing from the scope of the present invention.

The diffuser entry passage 316 may have an associated longitudinal length 320. In one embodiment, the longitudinal length 320 of the diffuser entry passage 316 is between 0.1 and 2.5 inches. In a particular embodiment, the longitudinal length 320 of the diffuser entry passage 316 is approximately 0.5 inches. It will be understood that the longitudinal length 320 of the diffuser entry passage 316 may be otherwise sized without departing from the scope of the present invention.

The diffuser passage 310 may also include a center passage 322 extending from the diffuser entry passage 316 to the outlet end 304 of the diffuser passage 310. The center passage 322 may be a converging, diverging, or straight passage. The center passage 322 may have an associated diameter or average width 324. In one embodiment, the width 324 of the center passage 322 is constant such that the center passage 322 is a straight passage. In this embodiment, the width 324 of the center passage 322 is between 2 and 10 times larger than the width 314 of the diffuser inlet 312. In a particular embodiment, the width 324 of the center passage 322 is approximately 3 times larger than the width 314 of the diffuser inlet 312. It will be understood that the center passage 322 may be otherwise configured and sized without departing from the scope of the present invention. It will be further understood that the diffuser passage 310 may be otherwise configured, including other and different tapered passages without departing from the scope of the present invention.

The dimensions of the diffuser 28 may be varied substantially depending upon the application. In particular, the configuration of the diffuser inlet 312, the longitudinal length 320 and the taper 318 of the diffuser entry passage 316, and the length and configuration of the center passage 322 may be optimized for each application to obtain desirable recovery of the fluid 34 and to minimize contamination of the chamber 42.

In operation, and as illustrated in FIGS. 1 and 4, the fluid 34 from the fluid plume 40 is substantially captured by the diffuser inlet 312 of the diffuser passage 310. The fluid 34 flows through the diffuser inlet 312 into the diffuser entry passage 316 which is a diverging passage that helps prevent the fluid 34 from back-streaming out of the diffuser passage 310 into the chamber 42. The fluid 34 then flows through the center passage 322 to the outlet end 304 of the diffuser passage 310 where the fluid 34 is removed by the recycle system 44, as illustrated in FIG. 1.

In short, the diffuser in combination with the nozzle is configured to utilize the dynamic properties of the fluid to direct the fluid, and other contaminants formed during operation of the emitted energy system, into the diffuser to increase the pressure within the diffuser. The increased pressure of the fluid within the diffuser reduces the pumping requirements of the chamber pump. Accordingly, the cost of the emitted energy system may be decreased. The diffuser also reduces plasma-induced erosion by capturing contaminants that may contaminate the emitted energy system or condense on optic elements. Furthermore, the diffuser maximizes the emitted energy collected and transmitted by the output optics and helps promote stable, continuous system operation.

Figure 5:
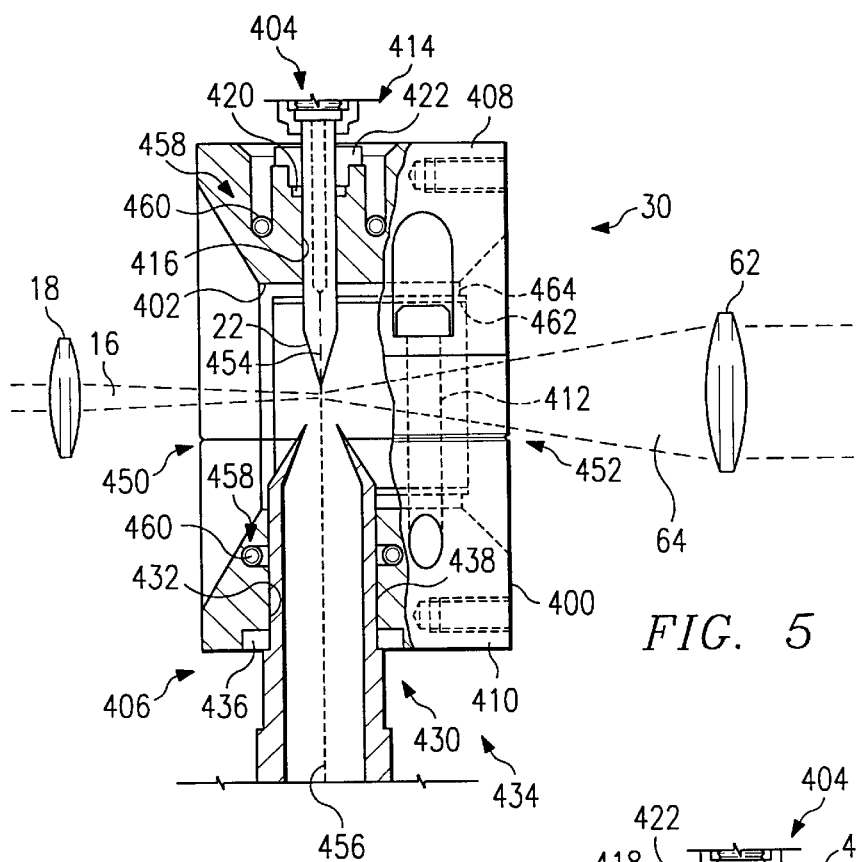
FIG. 5 is a side view in section with portions broken away illustrating a holder assembly used in the emitted energy system of FIG. 1 in accordance with one embodiment of the present invention.
Figure 6:
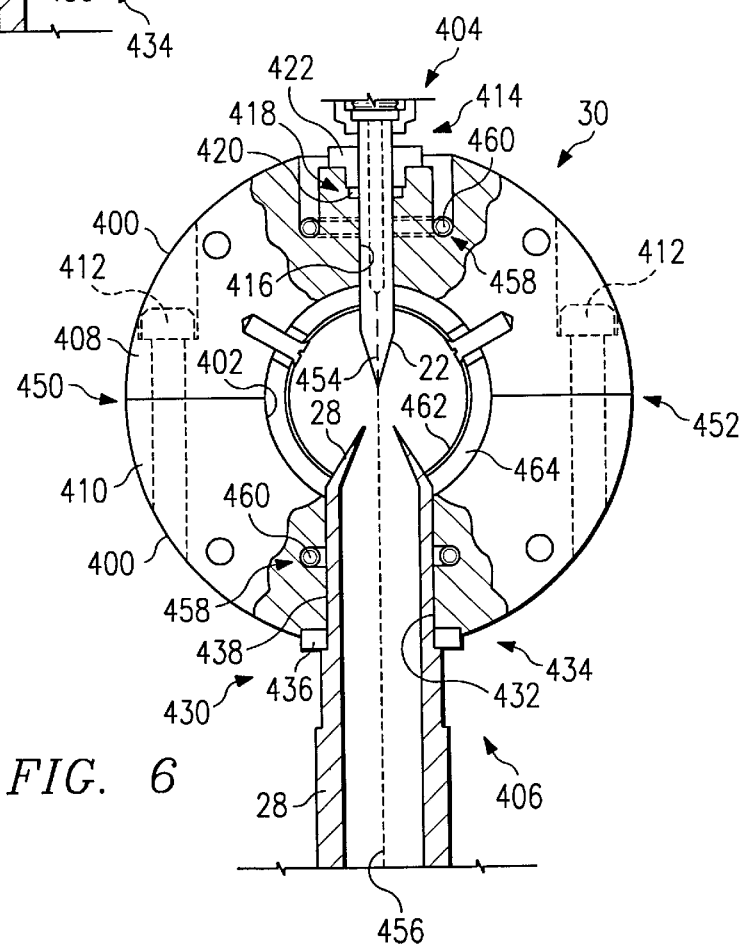
FIG. 6 is a rotated side view in section with portions broken away illustrating the holder assembly of FIG. 5 in accordance with one embodiment of the present invention.

FIGS. 5 and 6 are rotated side views in section with portions broken away illustrating a holder assembly 30 in accordance with one embodiment of the present invention. The holder assembly 30 operates to restrain and align the diffuser 28 with the nozzle 22 during operation of the emitted energy system 10. It will be understood that the holder assembly 30 may be otherwise used without departing from the scope of the present invention.

In one embodiment, the holder assembly 30 includes a housing assembly 400 in the configuration of an annular ring having an aperture 402. The housing assembly 400 may include a nozzle end 404 and a diffuser end 406. In one embodiment, the housing assembly 400 includes a nozzle receiver 408 and a diffuser receiver 410 coupled together by at least one bolt 412. In this embodiment, the housing assembly 400 may include thermal insulation (not shown) between the nozzle receiver 408 and the diffuser receiver 410. The thermal insulation aids in the precise control of the temperature of both the nozzle receiver 408 and the diffuser receiver 410. It will be understood that the holder assembly 30 may be otherwise configured without departing from the scope of the present invention. For example, the housing assembly 400 may be configured as a single piece annular ring, or other suitable configuration.

A nozzle mounting system 414 may be coupled to the nozzle end 404 of the housing assembly 400. The nozzle mounting system 414 operates to restrain and longitudinally align the nozzle 22 within the housing assembly 400. In one embodiment, the nozzle mounting system 414 includes a nozzle bore 416 radially disposed within the nozzle receiver 408. In this embodiment, the nozzle 22 is inserted and positioned within the nozzle bore 416.

The nozzle mounting system 414 may include a nozzle longitudinal alignment system 418. The nozzle longitudinal alignment system 418 may include a nozzle shim 420 inserted between the housing assembly 400 and the boss 108 illustrated in FIG. 2. The nozzle shim 420 provides precise longitudinal positioning of the nozzle 22 within the housing assembly 400. It will be understood that the nozzle longitudinal alignment system 418 may be otherwise configured without departing from the scope of the present invention.

The nozzle mounting system 414 may also comprise a nozzle retaining system 422. In one embodiment, the nozzle retaining system 422 may comprise a lock nut or a wedge fitting to restrain or lock the nozzle 22 in position within the housing assembly 400. It will be understood that the nozzle retaining system 422 may comprise other devices or systems for restraining the nozzle 22 in the housing assembly 400 without departing from the scope of the present invention. It will be further understood that the nozzle mounting system 414 may comprise other devices or systems for restraining and aligning the nozzle 22 in the housing assembly 400 without departing from the scope of the present invention.

A diffuser mounting system 430 may be coupled to the diffuser end 406 of the housing assembly 400. The diffuser mounting system 430 may be any device or system for restraining and longitudinally aligning the diffuser 28 within the housing assembly 400. In one embodiment, the diffuser mounting system 430 may include a diffuser bore 432 radially disposed within the diffuser receiver 410. In this embodiment, the diffuser 28 is inserted and positioned within diffuser bore 432.

The diffuser mounting system 430 may include a diffuser longitudinal alignment system 434. The diffuser longitudinal alignment system 434 may include a diffuser shim 436 inserted between the housing assembly 400 and the diffuser boss 308. The diffuser shim 436 provides precise longitudinal positioning of the diffuser 28 within the housing assembly 400. It will be understood that the diffuser longitudinal alignment system 434 may be otherwise configured without departing from the scope of the present invention.

The diffuser mounting system 430 may also include a diffuser retaining system 438. In one embodiment, the diffuser retaining system 438 may comprise a lock nut or a wedge fitting to restrain or lock the diffuser 28 in position within the housing assembly 400. It will be understood that the diffuser retaining system 438 may be any device or system for restraining the diffuser 28 in the housing assembly 400 without departing from the scope of the present invention. It will be further understood that the diffuser mounting system 430 may comprise other devices or systems for restraining and aligning the diffuser 28 in the housing assembly 400 without departing from the scope of the present invention.

The holder assembly 30 may also include an alignment system 450 that operates to provide spatial alignment between the nozzle 22 and the diffuser 28 to optimize operation of the diffuser 28. The alignment system 450 may include the nozzle longitudinal alignment system 418 and a diffuser longitudinal alignment system 452, along with a lateral alignment system 452.

In one embodiment, the lateral alignment system 452 may include shims (not shown) in the nozzle bore 416, the diffuser bore 432, and/or between the nozzle receiver 408 and the diffuser receiver 410. The lateral alignment system 452 may also include oversized holes (not shown) used in the housing assembly 400 at each bolt 412 location. The lateral alignment system 452 operates to adjust the nozzle 22 and the diffuser 28 such that a flow centerline 454 of the nozzle 22 and the flow centerline 456 of the diffuser 28 are parallel or substantially inline. It will be understood that the lateral alignment system 452 may be otherwise configured without departing from the scope of the present invention. It will be further understood that the alignment system 450 may include other spatial positioning devices and systems without departing from the scope of the present invention.

The holder assembly 30 may also include a cooling system 458 for maintaining the temperature of the holder assembly 30 precisely within a specified range. In one embodiment, the cooling system 458 includes a cooling jacket (not shown), connecting lines (not shown), and a refrigeration system (not shown). In this embodiment, the cooling system 458 circulates a cooling fluid (not shown)

through the cooling jacket to cool the housing assembly 400, the nozzle 22, and the diffuser 28. In another embodiment, the cooling system 458 circulates the cooling fluid through coolant passages 460 within the housing assembly 400. In a particular embodiment, the cooling system 458 individually cools the nozzle receiver 408 and the diffuser receiver 410. It will be understood that the cooling system 458 may be otherwise configured without departing from the scope of the present invention.

The holder assembly 30 may also include a radiative heat shield 462 formed within the aperture 402 of the housing assembly 400. In one embodiment, the shield 462 may be substantially cylindrical and include a reflective coating that forms a component of the output optics 18 and inhibits radiative heat transfer from the emitted energy 16 to the housing assembly 400. The shield 462 may have a separate cooling line system (not shown) for cooling the radiative heat shield 462. It will be understood that the shield 462 may be otherwise configured to allow the emitted energy 16 to be reflected while minimally obstructing the collection of the emitted energy 16 during the operation of the emitted energy system 10.

An insulator 464 may be disposed between the housing assembly 400 and the shield 462. The shield 462 may have an increased temperature due to the effects of the emitted energy 16. The insulator 464 operates to insulate the housing assembly 400 from the temperature effects of the shield 462 that would otherwise increase the temperature of the housing assembly 400. In one embodiment, the insulator 464 comprises a gap between the housing assembly 400 and the shield 462. It will be understood that the insulator 464 may be comprise other suitable insulating materials and be otherwise formed without departing from the scope of the present invention.

The holder assembly 30 allows the nozzle 22 and the diffuser 28 to be prealigned as a subsystem 13. The subsystem 13 reduces the system downtime and maintenance and increases productivity, by allowing the subsystem 13 to be replaced as a unit.

In short, the holder assembly maintains an accurate alignment between the nozzle and diffuser. The holder assembly also allows the alignment between the nozzle and the diffuser to be maintained over an extended operational period of time. In addition, the holder assembly helps protect the nozzle and diffuser from the adverse affects of the emitted energy system, such as radiative heat from the emitted energy.

Although the present invention has been described with several embodiments, various changes and modifications may be suggested to one skilled in the art. It is intended that the present invention encompass such changes and modifications as fall within the scope of the present appended claims.

What is claimed is:

1. An emitted energy system for fabricating a semiconductor device, the emitted energy system comprising:
    an energy system and a fluid system that interact to produce an emitted energy, the emitted energy directed at a photolithography system interface to produce the semiconductor device;
    wherein the fluid system includes a nozzle, the nozzle comprising:
        a nozzle cavity disposed within a nozzle body and having an up-stream end and a down-stream end; and
        a nozzle passage defined within the nozzle cavity and extending a longitudinal length from the down-stream end of the nozzle cavity into the nozzle cavity, the longitudinal length of the nozzle passage is sufficient to produce clustering of a fluid flowing through the nozzle;
        the longitudinal length of the nozzle passage being sufficient to produce clustering of the fluid external to the nozzle; and
    wherein the fluid flowing through the down-stream end of the nozzle produces a fluid plume, external to the nozzle, that interacts with the energy system to produce the emitted energy.

2. The emitted. energy system of claim 1, further comprising a miniature tube insert disposed within the nozzle body, the miniature tube insert having an interior surface; and
    wherein the interior surface of the miniature tube insert defines, at least in part, the nozzle cavity.

3. The emitted energy system of claim 1, the nozzle passage further comprising:
    a discharge orifice at the down-stream end of the nozzle cavity and having an associated width; and
    wherein the width of the discharge orifice is substantially less than the longitudinal length of the nozzle passage.

4. The emitted energy system of claim 3, wherein the width of the discharge orifice is smaller than the longitudinal length of the nozzle passage by a factor of at least 20.

5. The emitted energy system of claim 3, wherein the width of the discharge orifice is less than 0.250 inches.

6. The emitted energy system of claim 5, wherein the width of the discharge orifice is approximately 0.02 inches.

7. An emitted energy system for fabricating a semiconductor device, the emitted energy system comprising:
    an energy system and a fluid system operable to interact to produce an emitted energy, the emitted energy directed at a photolithography system interface to produce the semiconductor device;
    the fluid system comprising a nozzle comprising:
        a nozzle cavity disposed within a nozzle body and having an up-stream end and a down-stream end;
        an external surface that is tapered adjacent the down-stream end to form a nozzle tip;
        a nozzle passage defined within the nozzle cavity and extending a longitudinal length from the down-stream end of the nozzle cavity into the nozzle cavity, the longitudinal length of the nozzle passage is sufficient to produce clustering of a fluid flowing through the nozzle; and
        the longitudinal length of the nozzle passage is sufficient to produce clustering of the fluid external to the nozzle; and
    the fluid flowing through the down-stream end of the nozzle to produce a fluid plume external to the nozzle, the fluid plume interacting with the energy system to produce the emitted energy.

8. The emitted energy system of claim 7, further comprising:
    a miniature tube insert disposed within the nozzle body;
    the miniature tube insert having an interior surface; and
    the interior surface of the miniature tube insert defining, at least in part, the nozzle cavity.

9. The emitted energy system of claim 7, wherein the nozzle passage further comprises:
    a discharge orifice at the down-stream end of the nozzle cavity and having an associated width; and
    the width of the discharge orifice is substantially less than the longitudinal length of the nozzle passage.

10. The emitted energy system of claim 9, wherein the width of the discharge orifice is smaller than the longitudinal length of the nozzle passage by a factor of at least 20.

11. The emitted energy system of claim 9, wherein the width of the discharge orifice is less than 0.250 inches.

12. The emitted energy system of claim 11, wherein the width of the discharge orifice is approximately 0.02 inches.

13. An emitted energy system for fabricating a semiconductor device, the emitted energy system comprising:

an energy system and a fluid system that interact to produce an emitted energy, the emitted energy directed at a photolithography system interface to produce the semiconductor device;

the fluid system comprising a nozzle, the nozzle further comprising:

a nozzle cavity disposed within a nozzle body and having an up-stream end and a down-stream end;

an external surface that is tapered adjacent the down-stream end to form a nozzle tip;

a nozzle passage defined within the nozzle cavity and extending a longitudinal length from the down-stream end of the nozzle cavity into the nozzle cavity, the longitudinal length of the nozzle passage is sufficient to produce clustering of a fluid flowing through the nozzle; and the longitudinal length of the nozzle passage is sufficient to produce clustering of a fluid external to the nozzle; and the fluid flowing through the down-stream end of the nozzle producing a fluid plume, external to the nozzle, that interacts with the energy system to produce the emitted energy;

a chamber coupled to the nozzle and operable to capture the fluid exiting the nozzle; and a recycle system removably coupled to the chamber, the recycle system operable to remove the captured fluid for recirculation to the fluid system.

14. The emitted energy system of claim 13, further comprising:

a miniature tube insert disposed within the nozzle body;

the miniature tube insert having an interior surface; and the interior surface of the miniature tube insert defining, at least in part, the nozzle cavity.

15. The emitted energy system of claim 13, wherein the nozzle passage further comprises:

a discharge orifice at the down-stream end of the nozzle cavity and having an associated width; and the width of the discharge orifice is substantially less than the longitudinal length of the nozzle passage.

16. The emitted energy system of claim 15, wherein the width of the discharge orifice is smaller than the longitudinal length of the nozzle passage by a factor of at least 20.

17. The emitted energy system of claim 15, wherein the width of the discharge orifice is less than 0.250 inches.

18. The emitted energy system of claim 17, wherein the width of the discharge orifice is approximately 0.02 inches.

* * * * *